US012726691B2

(12) United States Patent
Marinsek et al.

(10) Patent No.: US 12,726,691 B2
(45) Date of Patent: Sep. 1, 2026

(54) STRUCTURAL SUPPORT BEAMS USED AS ELECTRICAL CONDUCTORS IN COOLED INFRARED CAMERA HOUSINGS

(71) Applicant: Raytheon Company, Tewksbury, MA (US)

(72) Inventors: Stephen Marinsek, Albuquerque, NM (US); Brendan E. O'Rorke, Santa Barbara, CA (US)

(73) Assignee: Raytheon Company, Arlington, VA (US)

( * ) Notice: Subject to any disclaimer, the term of this patent is extended or adjusted under 35 U.S.C. 154(b) by 90 days.

(21) Appl. No.: 18/674,128

(22) Filed: May 24, 2024

(65) Prior Publication Data

US 2025/0365488 A1 Nov. 27, 2025

(51) Int. Cl.

*H04N 23/52* (2023.01)
*G03B 17/55* (2021.01)
*H04N 23/20* (2023.01)
*H04N 23/51* (2023.01)
*H05K 7/20* (2006.01)

(52) U.S. Cl.

CPC ............. *H04N 23/52* (2023.01); *G03B 17/55* (2013.01); *H04N 23/20* (2023.01); *H04N 23/51* (2023.01); *H05K 7/20372* (2013.01)

(58) Field of Classification Search

CPC ........ H04N 23/52; H04N 23/51; H04N 23/20; G03B 17/55; H05K 7/20372

USPC .......................................................... 348/164

See application file for complete search history.

(56) References Cited

U.S. PATENT DOCUMENTS 3,868,700 A * 2/1975 Kuramoto .............. G03B 17/00 396/246
7,002,154 B2 2/2006 Wellman et al.
7,278,278 B2 10/2007 Wowk et al.
9,147,711 B1 * 9/2015 Azuma ................. H10F 39/806
9,609,234 B1 * 3/2017 Checka ................. H10F 39/804
10,161,803 B2 12/2018 Carlson et al.
10,230,876 B2 * 3/2019 Wang ..................... H04N 23/51
11,162,763 B2 * 11/2021 Masarik ................ F41G 11/003
11,287,086 B1 * 3/2022 Mitchell ................. G01J 5/061
2006/0255275 A1 * 11/2006 Garman ................. H04N 23/20 250/338.1
2009/0244336 A1 * 10/2009 Busse .................... H04N 23/54 348/294
2010/0039553 A1 * 2/2010 Kim ....................... H04N 23/55 348/374
2013/0016220 A1 * 1/2013 Brown .................. G01J 3/2823 359/359
2017/0106892 A1 * 4/2017 Lisseman ............... H04N 23/51
2017/0328779 A1 * 11/2017 Carlson ................... G01J 5/046
2018/0343772 A1 * 11/2018 Raghupathy ....... H05K 7/20445
2019/0109166 A1 * 4/2019 Ide ......................... G03B 17/12
2021/0041220 A1 * 2/2021 Van Weeren .......... H04N 23/56
2022/0232152 A1 * 7/2022 Peng ...................... H04N 23/54
2025/0327988 A1 * 10/2025 Zhang ...................... G02B 7/18

* cited by examiner

*Primary Examiner* — Matthew David Kim

(57) ABSTRACT

A system includes an infrared camera sensor. The infrared camera sensor includes at least one electrical interface connection and a platform. The system also includes a cryocooler thermally coupled to the platform and at least one support strut mechanically supporting the platform. The at least one support strut includes at least one electrically-conductive spoke configured to interface with the at least one electrical interface connection.

20 Claims, 5 Drawing Sheets

STRUCTURAL SUPPORT BEAMS USED AS ELECTRICAL CONDUCTORS IN COOLED INFRARED CAMERA HOUSINGS

TECHNICAL FIELD

This disclosure generally relates to imaging devices. More specifically, this disclosure relates to structural support beams used as electrical conductors in cooled infrared camera housings.

BACKGROUND

To provide increased performance, components in infrared camera systems are cooled to cryogenic temperatures during operation, typically via cryocooler devices. For example, the cold finger of a cryocooler may be thermally coupled with a ceramic platform of an infrared camera sensor to maintain a cryogenic temperature at the infrared camera sensor. Furthermore, the infrared camera sensor may be housed within a camera housing that maintains a vacuum around the infrared camera sensor. The vacuum environment limits the transfer of heat from the housing to the infrared camera sensor via convection.

SUMMARY

This disclosure relates to structural support beams used as electrical conductors in cooled infrared camera housings.

In a first embodiment, an apparatus includes at least one electrically-conductive spoke configured to electrically interface with at least one electrical interface connection of an infrared camera sensor and mechanically support a platform that includes the infrared camera sensor.

In a second embodiment, a system includes an infrared camera sensor. The infrared camera sensor includes at least one electrical interface connection and a platform. The system also includes a cryocooler thermally coupled to the platform and at least one support strut mechanically supporting the platform. The at least one support strut includes at least one electrically-conductive spoke configured to interface with the at least one electrical interface connection.

In a third embodiment, a method includes cooling, via a cryocooler, an infrared camera system and obtaining infrared images using the cooled infrared camera system. The infrared camera system includes an infrared camera sensor. The infrared camera sensor includes at least one electrical interface connection and a platform thermally coupled to the cryocooler. The infrared camera system also includes at least one support strut mechanically supporting the platform. The at least one support strut includes at least one electrically-conductive spoke configured to interface with the at least one electrical interface connection. The infrared camera system further includes a housing mechanically attached to the at least one support strut. The housing is configured to provide a vacuum chamber for the infrared camera sensor.

Other technical features may be readily apparent to one skilled in the art from the following figures, descriptions, and claims.

BRIEF DESCRIPTION OF THE DRAWINGS

For a more complete understanding of this disclosure, reference is made to the following description, taken in conjunction with the accompanying drawings, in which.

DETAILED DESCRIPTION

FIGS. 1 through 3B, described below, and the various embodiments used to describe the principles of the present disclosure are by way of illustration only and should not be construed in any way to limit the scope of this disclosure. Those skilled in the art will understand that the principles of the present disclosure may be implemented in any type of suitably arranged device or system.

As noted above, to provide increased performance, components in infrared camera systems are cooled to cryogenic temperatures during operation, typically via cryocooler devices. For example, the cold finger of a cryocooler may be thermally coupled with a ceramic platform of an infrared camera sensor to maintain a cryogenic temperature at the infrared camera sensor. Furthermore, the infrared camera sensor may be housed within a camera housing that maintains a vacuum around the infrared camera sensor. The vacuum environment limits the transfer of heat from the housing to the infrared camera sensor via convection. Electrical connections, such as wirebonds, are utilized to interface the infrared camera sensor with other electronic elements of the infrared camera system. However, each electrical connection introduces additional heat load into the environment of the infrared camera sensor. Often times, to compensate for the additional heat load, a larger cryocooler is utilized for systems with additional electrical connections, which adds size and weight to the overall infrared camera system. This disclosure describes how structural support beams may be used as electrical conductors in cooled infrared camera housings, which can help to reduce or minimize heat transfer from an infrared camera housing to an infrared camera.

Figure 1:
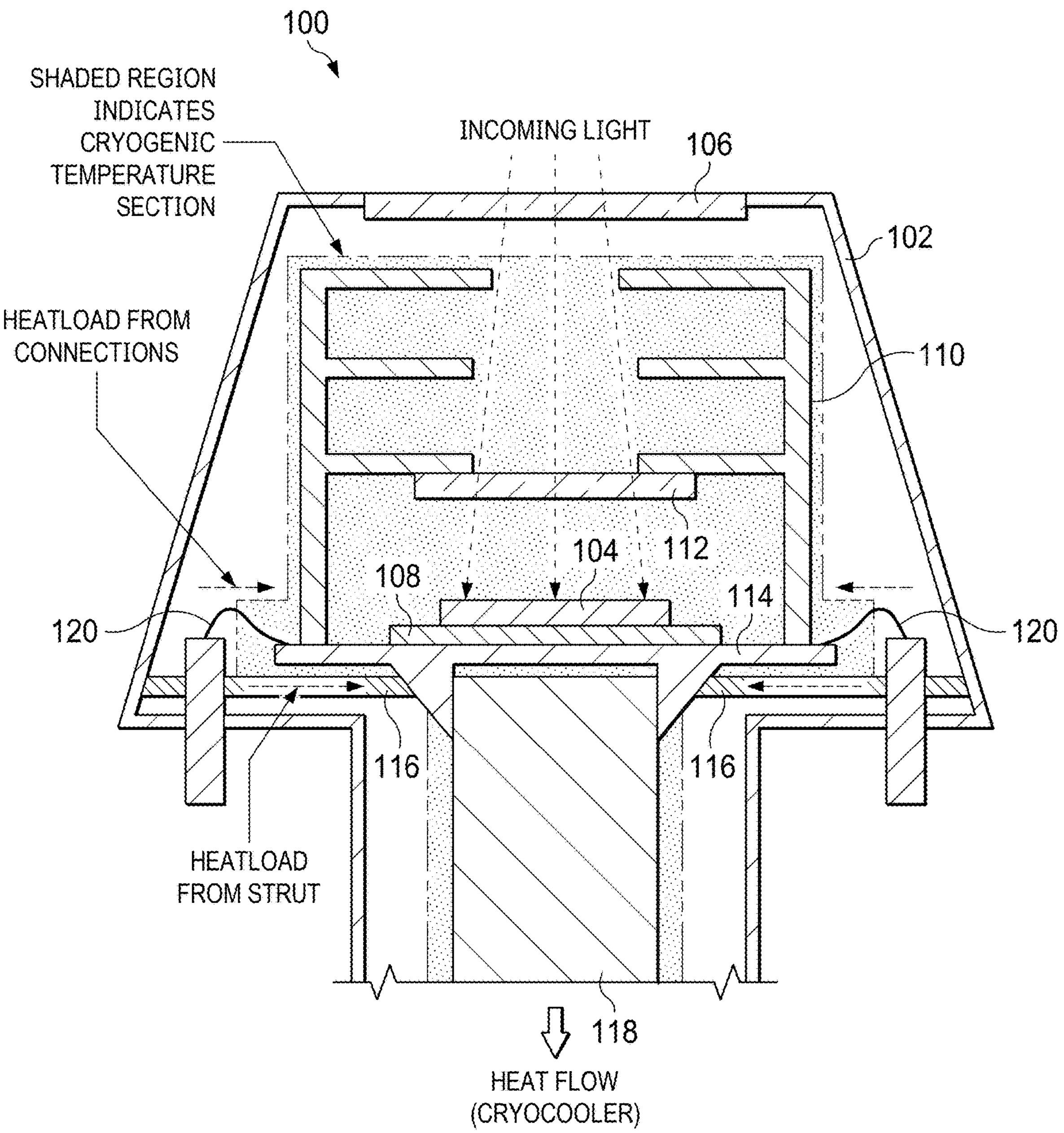
FIG. 1 illustrates an example front end of a cooled infrared camera system in accordance with this disclosure.

FIG. 1 illustrates an example front end of a cooled infrared camera system 100 in accordance with this disclosure. FIG. 1 shows a side view of infrared camera system 100 that includes a housing 102. During operation of infrared camera system 100, a vacuum is maintained within housing 102 to reduce the transfer of heat from housing 102 to infrared camera sensor 104 via convection. Housing 102 includes a window 106 which allows incoming light to strike the focal plane assembly 108 of infrared camera sensor 104. Within housing 102, infrared camera system 100 includes a cold shield 110 and a cold filter 112, which reduce the transfer of heat from housing 102 to infrared camera sensor 104 via radiation. Infrared camera sensor 104 is supported by a platform 114. Platform 114 may be of a ceramic material and may include a number of electrical interface connections for the infrared camera sensor 104. Platform 114 is mechanically stabilized within housing 102 via a plurality of support struts 116. Support struts 116 may also be referred to as structural support beams. To provide cryogenic temperatures for infrared camera sensor 104, a cold finger from a cryocooler 118 is thermally coupled to platform 114. The cold finger of cryocooler 118 conducts heat away from platform 114 during operation of infrared camera system 100, and further conducts heat away from other components of infrared camera system 100 that are thermally coupled to platform 114. The shaded region of FIG. 1 indicates the cryogenic temperature section of infrared camera system 100. A number of electrical connections 120 are provided that interface infrared camera sensor 104 with other components of infrared camera system 100 that operate outside of housing 102 (not shown).

Although FIG. 1 illustrates one example of a front end of a cooled infrared camera system 100, various changes may be made to FIG. 1. For example, the number of electrical connections may vary, the number of support struts may vary, the size of the cryocooler may vary etc.

As noted above, each electrical connection (such as electrical connections 120 of FIG. 1) add additional heat load to a cooled infrared camera system. If the number of electrical connections within the cryogenic temperature section of a cooled infrared camera system is reduced, the system should have a reduced heat load. Due to the reduced heat load, the cooled infrared camera system may utilize a smaller capacity cryocooler, which may reduce the overall size, weight, and power consumption of the cooled infrared camera system. The present disclosure provides a solution that utilizes electrically-conductive support struts to reduce the total number of electrical connections within the cryogenic temperature section of a cooled infrared camera system, thereby reducing the total heat load of the system. For example, an electrically-conductive support strut may interface with several electrical interface connections that traditionally utilize multiple wire bonds in the cryogenic temperature section of a cooled infrared camera system, such as grounds, video processing supplies, power connections etc. By utilizing the electrically-conductive support strut to provide one or more of these electrical connections with the infrared camera sensor, the typically associated wirebonds may be eliminated. Examples of cooled infrared camera systems utilizing electrically-conductive support struts are shown in FIGS. 2A and 2B, and FIGS. 3A and 3B.

Figure 2A:
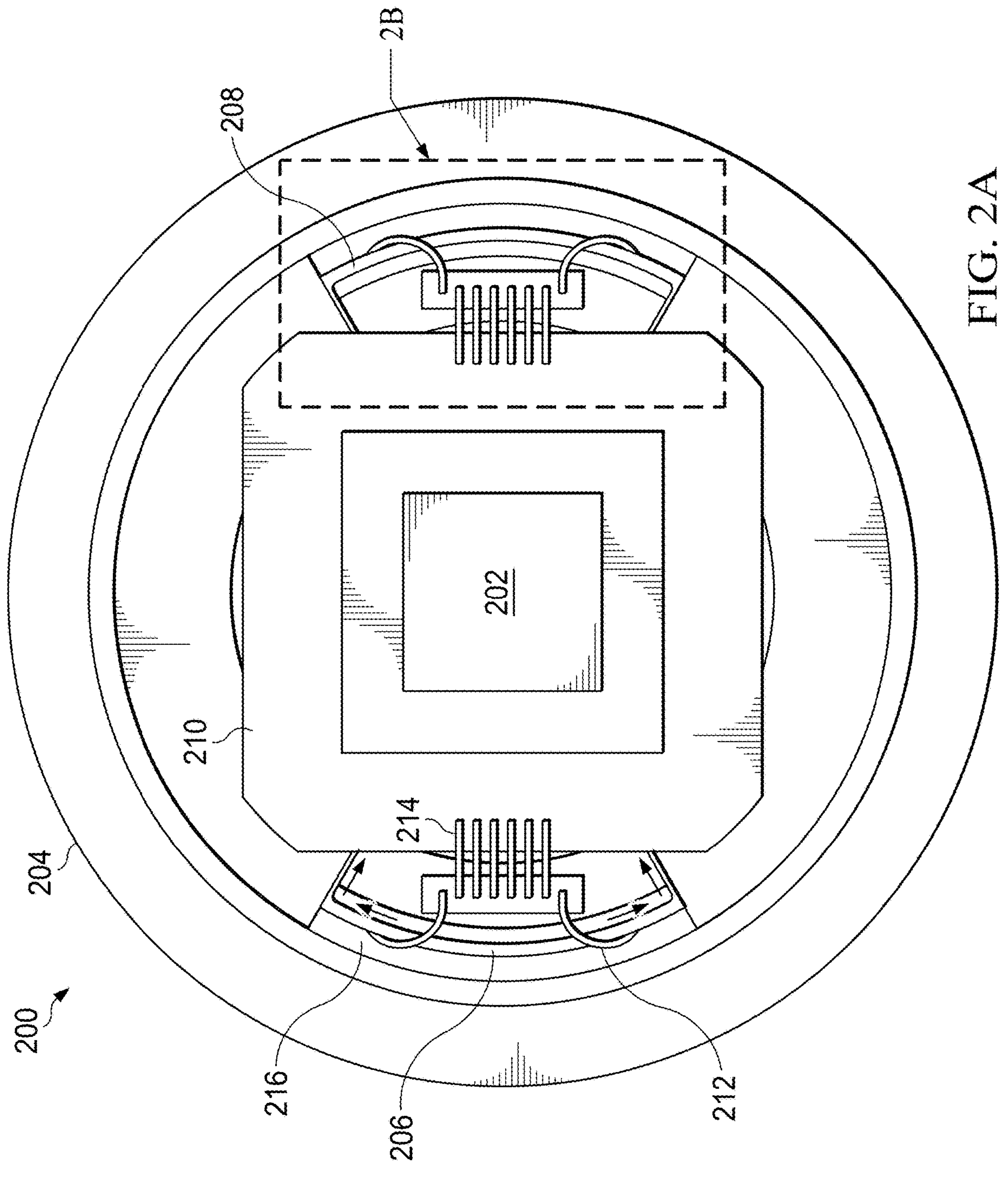
FIGS. 2A and 2B illustrate another example front end of a cooled infrared camera system in accordance with this disclosure.
Figure 2B:
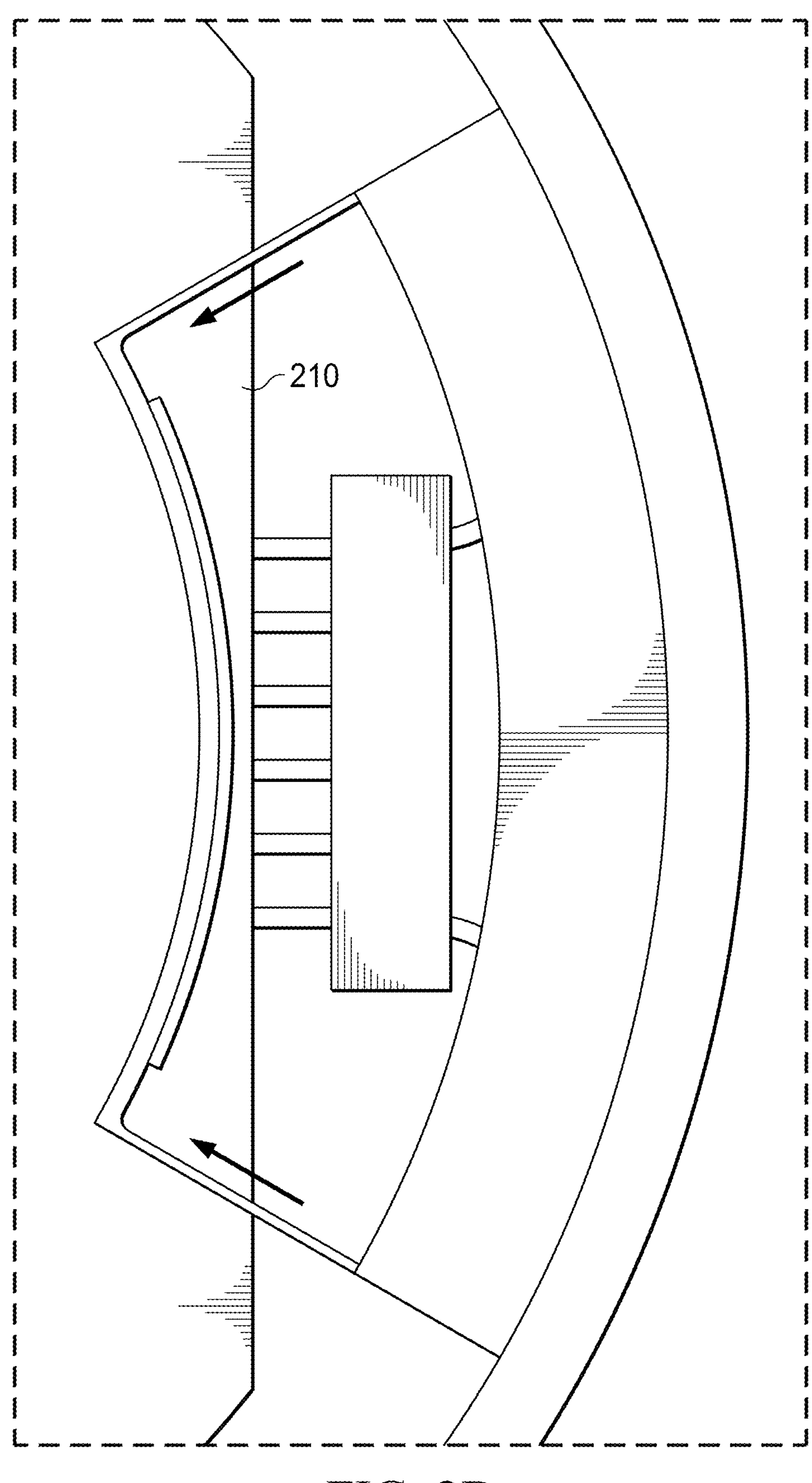

FIGS. 2A and 2B illustrate another example front end of a cooled infrared camera system 200 in accordance with this disclosure. Infrared camera system 200 may include the components of infrared camera system 100 of FIG. 1. However, for clarity, several components from infrared camera system 100 are not shown in the example of FIGS. 2A and 2B. FIG. 2A shows a top down view of infrared camera system 200 that includes an infrared camera sensor 202, a housing 204, a support strut 206 and a support strut 208. Infrared camera sensor 202 may be similar to infrared camera sensor 104 of FIG. 1 and includes a platform 210. FIG. 2B shows a bottom up enlargement view of support strut 208. In the example of FIG. 2A, it can be seen that support strut 206 includes a plurality of electrically-conductive spokes. The electrically-conductive spokes interface with infrared camera sensor 202 on a bottom side of platform 210. The interface with the bottom side of platform 210 is more explicitly shown in FIG. 2B, where it can be seen that support strut 208 is fastened to the bottom of platform 210. For example, support strut 208 may be fastened to platform 210 by brazing, soldering, welding, conductive adhesive, threaded fasteners, etc. However, it should be understood that any form of fastening may be used to fasten support strut 208 to platform 210. In this example, support strut 208 may be considered analogous to support strut 206. Furthermore, it can be seen in FIG. 2A that a plurality of wirebonds 214 interface with a top side of platform 210, and a plurality of wirebonds 212 interface with support strut 206. Arrows highlight an electrical path through support strut 206 through which wirebonds 212 are electrically coupled to the bottom side of platform 210. Because wirebonds 212 are electrically coupled to the bottom side of platform 210 via support strut 206, wirebonds 212 fall outside of the cryogenic temperature section of infrared camera system 200, and do not introduce additional heat load into the cryogenic temperature section. In the example of FIGS. 2A and 2B, it can be seen that support struts 206 and 208 are mated to housing 204 via dielectric supports. For example, support strut 206 is mated to housing 204 via dielectric support 216. The dielectric supports electrically and thermally isolate support struts 206 and 208 from housing 204. In this manner, heat conduction from housing 204 through support struts 206 and 208 is reduced.

Although FIGS. 2A and 2B illustrate one example of a front end of a cooled infrared camera system 200 various changes may be made to FIGS. 2A and 2B. For example, the number of electrical connections may vary, the number of support struts may vary, the number of spokes on the support struts may vary, etc. Additionally, while support struts 206 and 208 are described as being analogous, it should be understood that support struts 206 and 208 may be of a different design, may send or receive different electrical signals, etc. For example, support struts 206 and 208 may interface with different electrical interface connections of infrared camera sensor 202, and each spoke of support struts 206 and 208 may interface with a different electrical interface connection of infrared camera sensor 202.

While FIGS. 2A and 2B illustrate an example where the electrically-conductive support struts are mated to the housing of the infrared camera system via dielectric supports, the electrically-conductive support struts may be mated to the housing according to any mode of fastening. For example, the electrically-conductive support struts may be mated to the housing via an adhesive bond. This may reduce the number of parts in the infrared camera system. An example of such an embodiment is shown in FIGS. 3A and 3B.

Figure 3A:
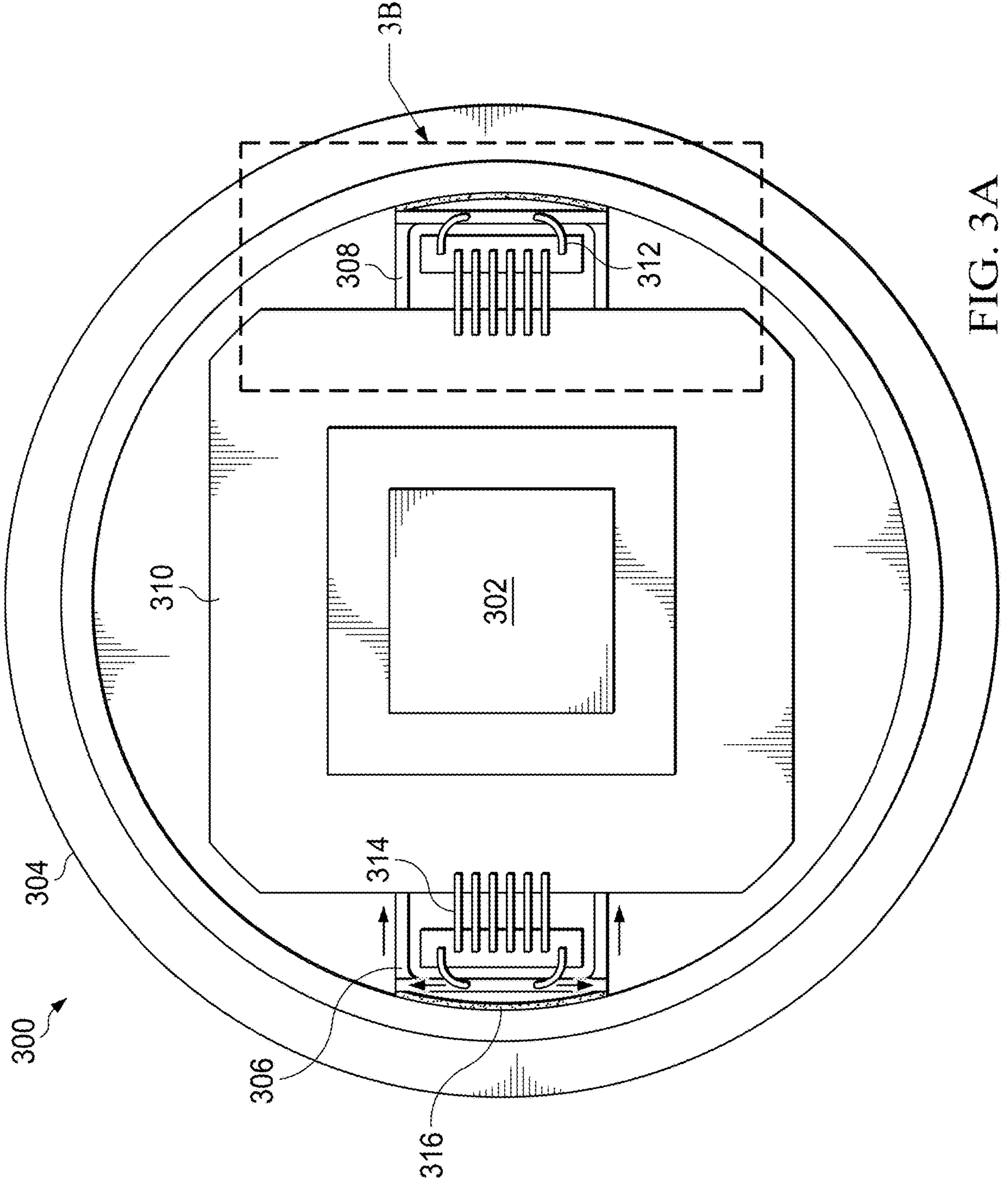
FIGS. 3A and 3B illustrate another example front end of a cooled infrared camera system in accordance with this disclosure.
Figure 3B:
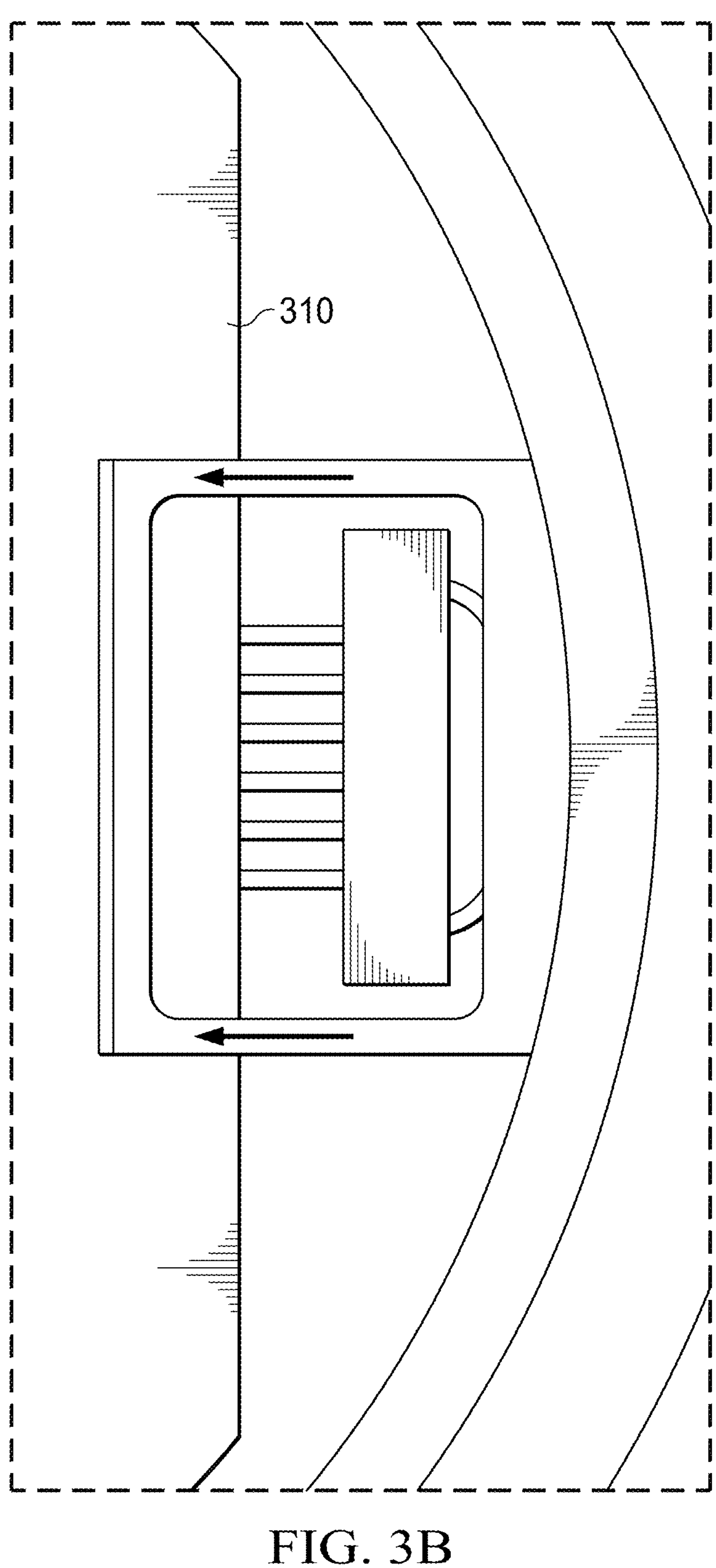

FIGS. 3A and 3B illustrate another example front end of a cooled infrared camera system 300 in accordance with this disclosure. Infrared camera system 300 may include the components of infrared camera system 100 of FIG. 1. However, for clarity, several components from infrared camera system 100 are not shown in the example of FIGS. 3A and 3B. FIG. 3A shows a top down view of infrared camera system 300 that includes an infrared camera sensor 302, a housing 304, a support strut 306 and a support strut 308. Infrared camera sensor 302 may be similar to infrared camera sensor 104 of FIG. 1 and includes a platform 310. FIG. 3B shows a bottom up enlargement view of support strut 308. In the example of FIG. 3A, it can be seen that support strut 306 includes plurality of electrically-conductive spokes. The electrically-conductive spokes interface with infrared camera sensor 302 on a bottom side of platform 310. The interface with the bottom side of platform 310 is more explicitly shown in FIG. 3B, where it can be seen that support strut 308 is fastened to the bottom of platform 310. For example, support strut 308 may be fastened to platform 310 by brazing, soldering, welding, conductive adhesive, threaded fasteners, etc. However, it should be understood that any form of fastening may be used to fasten support strut 308 to platform 310. In this example, support strut 308 may be considered analogous to support strut 306. Furthermore, it can be seen in FIG. 3A that a plurality of wirebonds 314 interface with a top side of platform 210, and a plurality of wirebonds 312 interface with support strut 306. Arrows highlight an electrical path through support strut 306 through which wirebonds 312 are electrically coupled to the bottom side of platform 310. Because wirebonds 312 are electrically coupled to the bottom side of platform 310 via support strut 306, wirebonds 312 fall outside of the cryogenic temperature section of infrared camera system 300, and do not introduce additional heat load into the cryogenic temperature section. In the example of FIG. 3, it can be seen that support struts 306 and 308 are mated to housing 304 via adhesive bonds. For example, support strut 306 is mated to housing 304 via adhesive bond 316. The adhesive bonds electrically and thermally isolate support struts 306 and 308 from housing 304. In this manner, heat conduction from housing 304 through support struts 306 and 308 is reduced.

Although FIGS. 3A and 3B illustrate one example of a front end of a cooled infrared camera system 300 various changes may be made to FIGS. 3A and 3B. For example, the number of electrical connections may vary, the number of support struts may vary, the number of spokes on the support struts may vary, etc. Additionally, while support struts 306 and 308 are described as being analogous, it should be understood that support struts 306 and 308 may be of a different design, may send or receive different electrical signals, etc. For example, support struts 306 and 308 may interface with different electrical interface connections of infrared camera sensor 302, and each spoke of support struts 306 and 308 may interface with a different electrical interface connection of infrared camera sensor 202.

It may be advantageous to set forth definitions of certain words and phrases used throughout this patent document. The terms "include" and "comprise," as well as derivatives thereof, mean inclusion without limitation. The term "or" is inclusive, meaning and/or. The phrase "associated with," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, have a relationship to or with, or the like. The phrase "at least one of," when used with a list of items, means that different combinations of one or more of the listed items may be used, and only one item in the list may be needed. For example, "at least one of: A, B, and C" includes any of the following combinations: A, B, C, A and B, A and C, B and C, and A and B and C.

The description in the present disclosure should not be read as implying that any particular element, step, or function is an essential or critical element that must be included in the claim scope. The scope of patented subject matter is defined only by the allowed claims. Moreover, none of the claims invokes 35 U.S.C. § 112(f) with respect to any of the appended claims or claim elements unless the exact words "means for" or "step for" are explicitly used in the particular claim, followed by a participle phrase identifying a function. Use of terms such as (but not limited to) "mechanism," "module," "device," "unit," "component," "element," "member," "apparatus," "machine," "system," "processor," or "controller" within a claim is understood and intended to refer to structures known to those skilled in the relevant art, as further modified or enhanced by the features of the claims themselves, and is not intended to invoke 35 U.S.C. § 112(f).

While this disclosure has described certain embodiments and generally associated methods, alterations and permutations of these embodiments and methods will be apparent to those skilled in the art. Accordingly, the above description of example embodiments does not define or constrain this disclosure. Other changes, substitutions, and alterations are also possible without departing from the spirit and scope of this disclosure, as defined by the following claims.

What is claimed is:

1. An apparatus comprising:
- at least one electrically-conductive spoke configured to:
  - electrically interface with at least one electrical interface connection of an infrared camera sensor; and
  - mechanically support a platform that includes the infrared camera sensor.

2. The apparatus of claim 1, wherein:
- the at least one electrically-conductive spoke comprises a support strut; and
- the support strut is configured to mate to an infrared camera housing.

3. The apparatus of claim 2, further comprising:
- a dielectric support configured to mate the support strut to the infrared camera housing.

4. The apparatus of claim 2, further comprising:
- an adhesive bond configured to mate the support strut to the infrared camera housing.

5. The apparatus of claim 2, further comprising the platform;
- wherein the platform comprises the at least one electrical interface connection; and
- wherein the at least one electrically-conductive spoke is fastened to the platform.

6. The apparatus of claim 5, wherein the platform is configured to thermally couple to a cryocooler.

7. The apparatus of claim 6, wherein the at least one electrically-conductive spoke is configured to thermally couple to the cryocooler via the platform.

8. The apparatus of claim 7, wherein:
- the at least one electrically-conductive spoke comprises a plurality of electrically-conductive spokes;
- the at least one electrical interface connection comprises a plurality of electrical interface connections; and
- each of the electrically-conductive spokes is configured to electrically interface with a different one of the electrical interface connections.

9. A system comprising:
- an infrared camera sensor comprising:
  - at least one electrical interface connection; and
  - a platform;
- a cryocooler thermally coupled to the platform; and
- at least one support strut mechanically supporting the platform, the at least one support strut comprising at least one electrically-conductive spoke configured to interface with the at least one electrical interface connection.

10. The system of claim 9, further comprising:
- a housing mechanically attached to the at least one support strut, the housing configured to provide a vacuum chamber for the infrared camera sensor.

11. The system of claim 10, wherein an adhesive bond attaches the housing to the at least one support strut.

12. The system of claim 10, wherein a dielectric support attaches the housing to the at least one support strut.

13. The system of claim 9, wherein:
- the platform comprises the at least one electrical interface connection; and
- the at least one electrically-conductive spoke is fastened to the platform.

14. The system of claim 13, wherein the at least one electrically-conductive spoke is thermally coupled to the cryocooler via the platform.

15. The system of claim 14, wherein:
- the at least one electrical interface connection is on a bottom side of the platform; and the at least one electrically-conductive spoke is attached to the bottom side of the platform.

16. The system of claim 15, wherein:

the at least one electrically-conductive spoke comprises a plurality of electrically-conductive spokes;

the at least one electrical interface connection comprises a plurality of electrical interface connections; and each of the electrically-conductive spokes is configured to electrically interface with a different one of the electrical interface connections.

17. A method comprising:

cooling, via a cryocooler, an infrared camera system; and obtaining infrared images using the cooled infrared camera system;

wherein the infrared camera system comprises:

an infrared camera sensor comprising:

at least one electrical interface connection; and a platform thermally coupled to the cryocooler;

at least one support strut mechanically supporting the platform, the at least one support strut comprising at least one electrically-conductive spoke configured to interface with the at least one electrical interface connection; and a housing mechanically attached to the at least one support strut, wherein the housing is configured to provide a vacuum chamber for the infrared camera sensor.

18. The method of claim 17, wherein the at least one electrically-conductive spoke is thermally coupled to the cryocooler via the platform.

19. The method of claim 18, wherein:

the at least one electrical interface connection is on a bottom side of the platform; and the at least one electrically-conductive spoke is attached to the bottom side of the platform.

20. The method of claim 19, wherein:

the at least one electrically-conductive spoke comprises a plurality of electrically-conductive spokes;

the at least one electrical interface connection comprises a plurality of electrical interface connections; and each of the electrically-conductive spokes is configured to electrically interface with a different one of the electrical interface connections.

* * * * *